United States Patent [19]
Rokos

[11] Patent Number: 5,347,237
[45] Date of Patent: Sep. 13, 1994

[54] CRYSTAL OSCILLATOR

[75] Inventor: George H. S. Rokos, Bishop's Stortford, United Kingdom

[73] Assignee: Northern Telecom Limited, Montreal, Canada

[21] Appl. No.: 64,156

[22] PCT Filed: Dec. 20, 1991

[86] PCT No.: PCT/GB91/02287

§ 371 Date: Aug. 16, 1993

§ 102(e) Date: Aug. 16, 1993

[87] PCT Pub. No.: WO92/11691

PCT Pub. Date: Jul. 9, 1992

[30] Foreign Application Priority Data

Dec. 20, 1990 [GB] United Kingdom ............... 9027738

[51] Int. Cl.$^5$ ............................................... H03B 5/36
[52] U.S. Cl. ............................. 331/116 FE; 331/158; 331/177 R; 331/183
[58] Field of Search ................ 331/34, 36 R, 113 R, 331/116 R, 117 R, 117 FE, 144, 158, 176, 177 R, 183

[56] References Cited

U.S. PATENT DOCUMENTS 5,034,706  7/1991  Betti et al. ................. 331/177 R X
5,187,450  2/1993  Wagner et al. ............... 331/177 R Primary Examiner—David Mis
Attorney, Agent, or Firm—Lee, Mann, Smith, McWilliams, Sweeney & Ohlson

[57] ABSTRACT

A tuneable crystal oscillator arrangement includes a piezo-electric, e.g. quartz, crystal and drive current means therefor. A reactance is arranged in series with the crystal and is fed with a current corresponding to the crystal drive current. The corresponding voltage developed across the impedance is fed via a variable gain amplifier back to the crystal. The reactance comprises a number of impedances, there being current steering means for dividing the current between the impedances. This determines the effective value of the reactance and provides a control or adjustment of the crystal frequency.

6 Claims, 10 Drawing Sheets

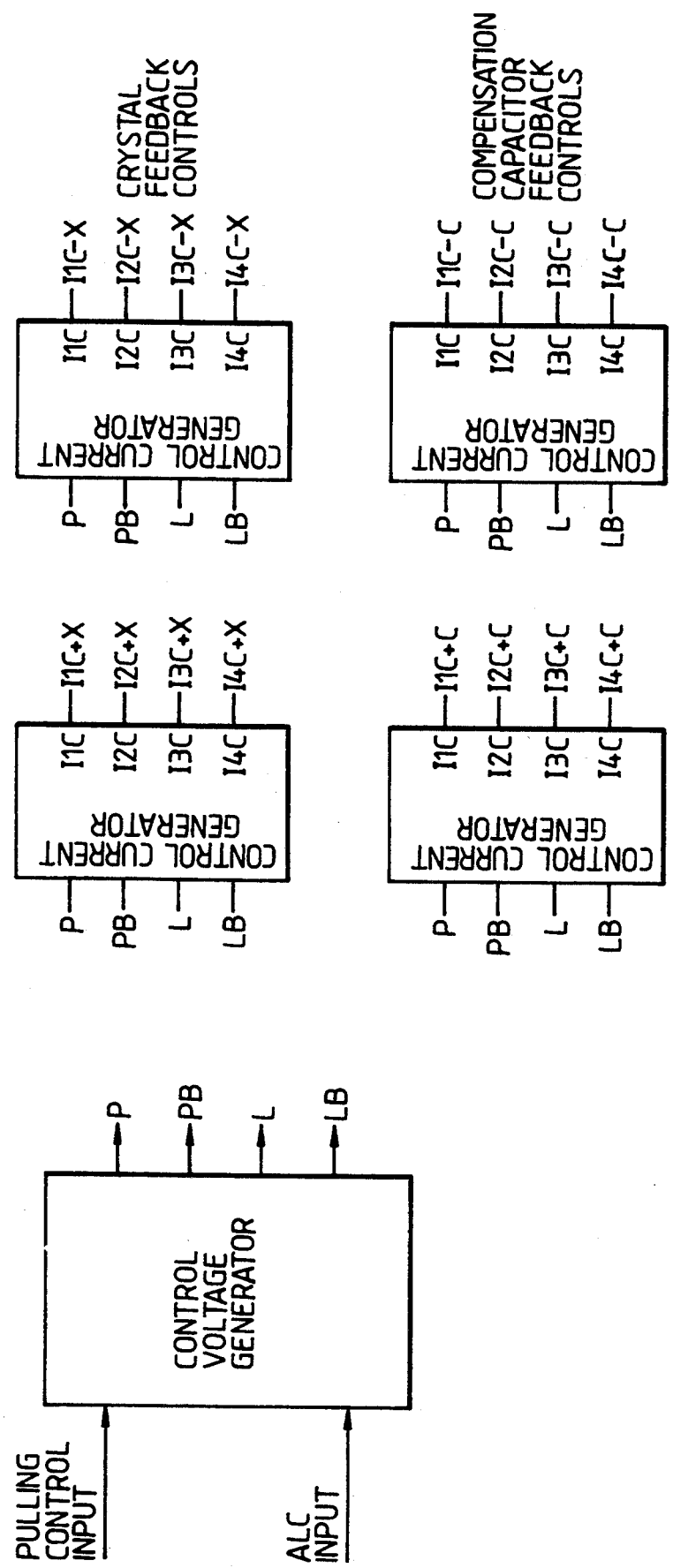

CRYSTAL OSCILLATOR

This invention relates to voltage controlled oscillators and in particular to oscillators in which a piezoelectric, e.g. quartz crystal provides a frequency determining function.

BACKGROUND OF THE INVENTION

Voltage controlled oscillators are widely used in frequency reference applications such as the construction of phase locked loop devices and tuneable filters. For high quality applications where accurate frequency control is required, a piezo-electric, e.g. quartz crystal element is employed. Such crystals have very precise and stable frequencies. The disadvantage of such an arrangement is that of providing some means of frequency tuning. Conventional circuits that provide this function are somewhat complex and costly.

The object of the present invention is to minimise or to overcome this disadvantage.

SUMMARY OF THE INVENTION

According to the invention there is provided a frequency tuneable crystal oscillator arrangement, including a piezo-electric crystal, means for providing a drive current to the crystal, a reactance into which a current corresponding to the crystal element is fed whereby to develop a corresponding voltage across that reactance, and an adjustable gain amplifier for amplifying said voltage and for feeding said amplified voltage back to the crystal, wherein said reactance is arranged in series with the crystal, and wherein the reactance comprises a plurality of different impedances, there being current steering means for dividing the current corresponding to the crystal current between the impedances whereby to determine the effective value of the reactance in series with the crystal whereby to control the crystal frequency.

BRIEF DESCRIPTION OF THE DRAWINGS

Embodiments of the invention will now be described with reference to the accompanying drawings in which:

FIGS. 8 to 13 illustrate the constitution of the oscillator arrangement of FIG. 7.

DESCRIPTION OF PREFERRED EMBODIMENT

Figure 1:
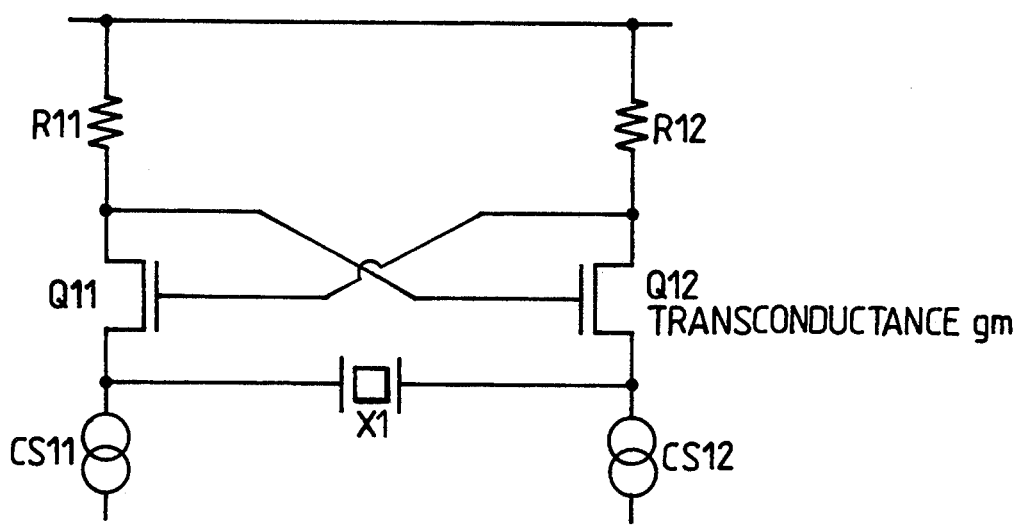
FIG. 1 shows schematically a Butler oscillator which is introduced for explanatory purposes.

Referring to FIG. 1, there is depicted a Butler oscillator circuit incorporating a crystal X1 connected to a pair of cross coupled field effect transistors Q11 and Q12, each having a load resistor R11, R12 coupled to its drain and a current source CS11, CS12 coupled to its source. It is a feature of this circuit that the impedance $Z_o$ presented at the crystal, when the oscillator is operating in its linear region, is substantially the difference between the source resistance of the transistors and the load impedance.

$$Z_0 = 2\left(\frac{1}{GM} - R\right)$$

Figure 2:
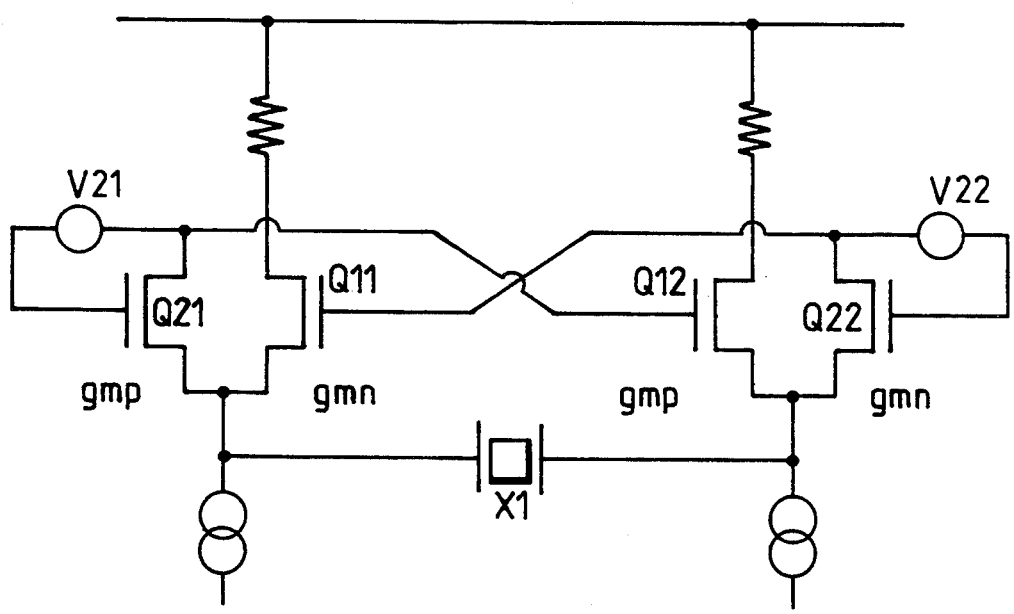
FIGS. 2 and 3 illustrate the manner in which the Butler circuit of FIG. 1 is modified.

Referring now to FIG. 2, we have found that the balanced arrangement of the Butler configuration allows the use of current steering to vary, in a controlled manner, the impedance $Z_1$ presented to the crystal X1. This is achieved by the introduction of a further pair of transistors Q21, Q22 each having means V21, V22 for controlling the difference between its gate voltage and that of its associated transistor Q11 or Q12 respectively. Usually V21=V22. The impedance 'seen' by the crystal $X_1$ is then given the expression $$Z_1 = \frac{2}{gmp + gmn}[1 + (gmp - gmn)R]$$

It will be appreciated that gmn are each voltage dependent and to a first order approximation $$gm \propto (V - VT_{TH})$$

This illustrates the principle whereby we employ current steering to control the reactance presented to the crystal.

Figure 3:
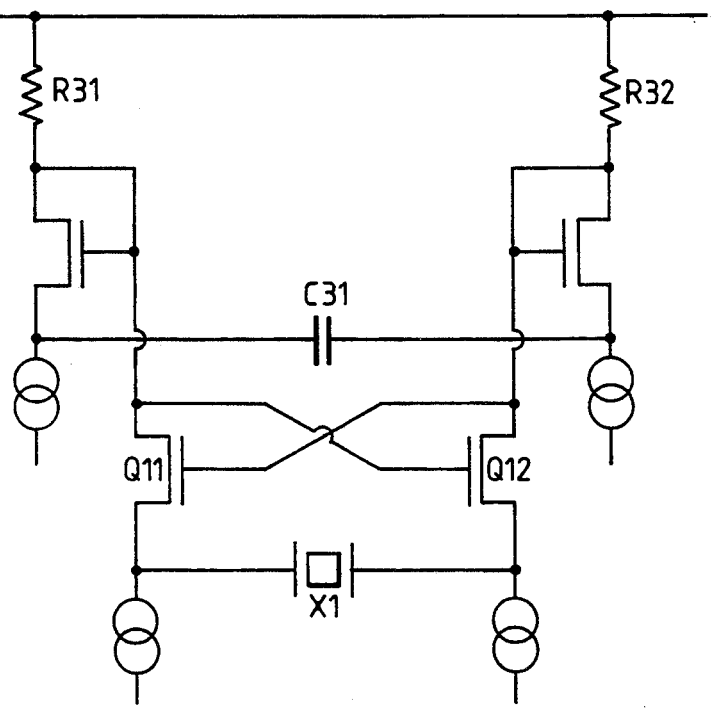

Referring to FIG. 3 we have found that a major problem inherent in the Butler arrangement can be overcome. The Butler circuit can operate as a source coupled multi-vibrator with the static capacitance Co of the crystal X1 completing the feedback loop. We overcome this problem by providing a secondary feedback loop, whose gain is inverted, via a compensating capacitor C31 whose value is substantially equal to Co. If we now add the currents in R31, R32 which are due to Co and to C31 respectively, we find that these substantially cancel, except within the frequency ranges where the crystal resonances dominate, thus avoiding multi-vibration at unwanted frequencies.

Figure 4:
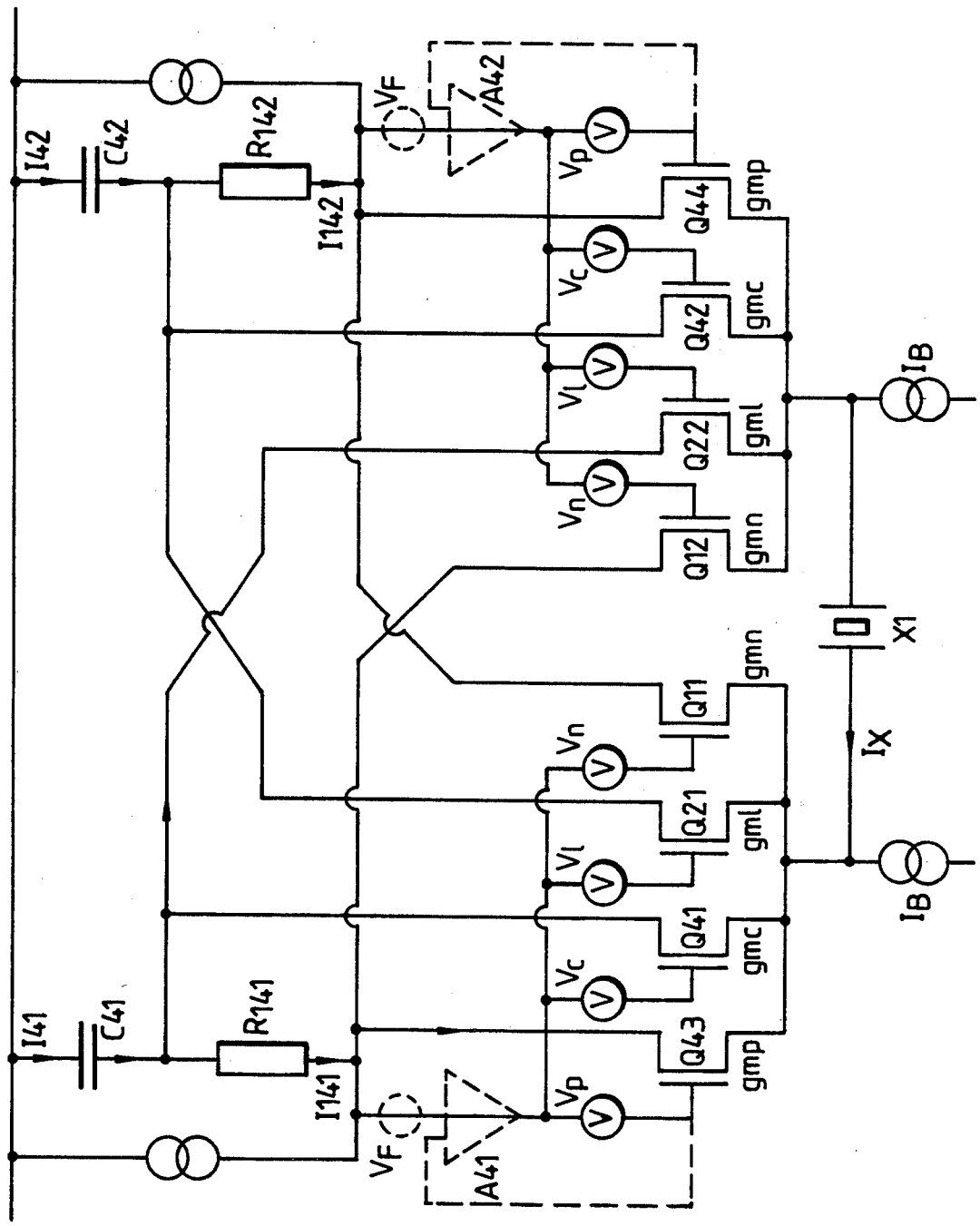
FIG. 4 illustrates one embodiment of the present invention.

Referring now to FIG. 4, this illustrates an embodiment of the invention. This can be considered as a development of the arrangement of FIG. 2 wherein capacitor loads C41, C42 each of value C 1 are provided for the transistors Q11, Q12, Q21 and Q22. Further transistors Q41 to 44 provide an amplifying/maintaining function. By way of illustration, we observe that when the adjusting voltages are varied between the conditions in which only one pair of transistors Q21 and Q22 or Q41 and Q42 are conducting the apparent series reactance is varied from positive to negative.

Thus, the circuit is arranged to provide a controlled varying impedance by dividing a current corresponding to the crystal current, between a plurality of paths, the division ratio being determined by the input control voltages. The current is steered between different load impedances by passing each current to be divided into the source terminals of a plurality of field effect transistors, the proportion of the current passing into each transistor being determined by a potential difference applied between that transistor gate and source terminals. The real and imaginary parts (the resistance and reactance) of the impedance are controlled independently. The linear functions of the voltages observed across the load impedances are presented to the crystal using for example feedback amplifiers to control the gate potentials of the current steering transistors.

The reactance and the gain are controlled via the transistor gate potentials $V_1$, $V_c$ and $V_n$.

In the circuit of FIG. 4, the design objective is to control the currents $I_{41}$, $I_{42}$, $I_{141}$ and $I_{142}$ such that $$I_{41} = -I_{42} = kIx$$

where Ix is the crystal current and k is the control function for reactance; and $$I_{141} = -I_{142} = gIx$$

where g is the control function for gain. The impedance Z 'seen' by the crystal is then given the expression $$Z = \text{reactance} + \text{resistance}$$
$$= V/Ix$$
$$= k\left(\frac{1}{C41jw} + \frac{1}{C42jw}\right) + g(R141 + R142)$$

To the first order this expression is given approximately by $$Z = \frac{gml - gmc - gmp + gmn}{gml + gmc + gmp + gmn}\left(\frac{1}{C41jw} + \frac{1}{C42jw}\right) +$$

$$(gmn - gmp)(R_{141} + R_{142})$$

It will be appreciated that, by suitable adjustment of the control voltages $V_1$, $V_c$, $V_p$ and $V_n$ which determine the corresponding values of $g_{ml}$, $g_{mc}$, $g_{mp}$ and $g_{mn}$, independent control of the reactance and gain may be achieved. Equally by combining the circuitry of FIG. 4 with the arrangements of FIG. 3, the effects of static capacitance Co may also be compensated. An oscillator design illustrating the combination of arrangements is shown in FIGS. 8-13.

Advantageously, the circuit of FIG. 4 is provided in integrated circuit form. The control voltages may conveniently be generated on-chip.

The circuit of FIG. 4 may be modified by the addition of voltage sources $V_F$ and feedback amplifiers A41, A42 shown in broken lines. It will be appreciated that the field effect transistors Q11 ... Q44 can present a significant series impedance to the crystal. The use of feedback in this way significantly reduces the effective in series impedance.

Figure 5:
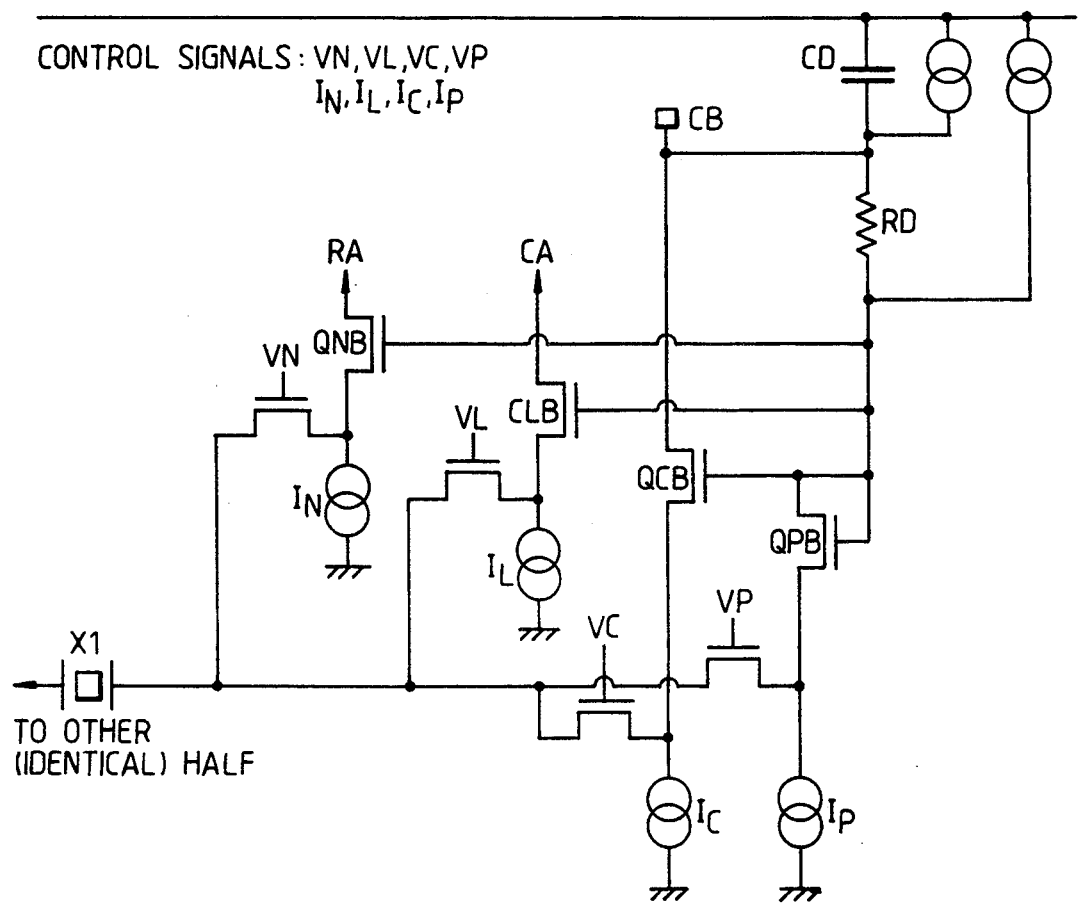
FIGS. 5 and 6 show further embodiments of the invention.

FIG. 5 illustrates an alternative circuit construction which allows independent adjustment of transconductance (gm) in such a way as to maintain the dynamic range. The circuit monitors the relationship between control current and frequency swing such that the dynamic range is substantially independent of changes in pulling. The circuit of FIG. 5 is symmetrical about the crystal X1 and only one half of the circuit is therefore shown.

Figure 6:
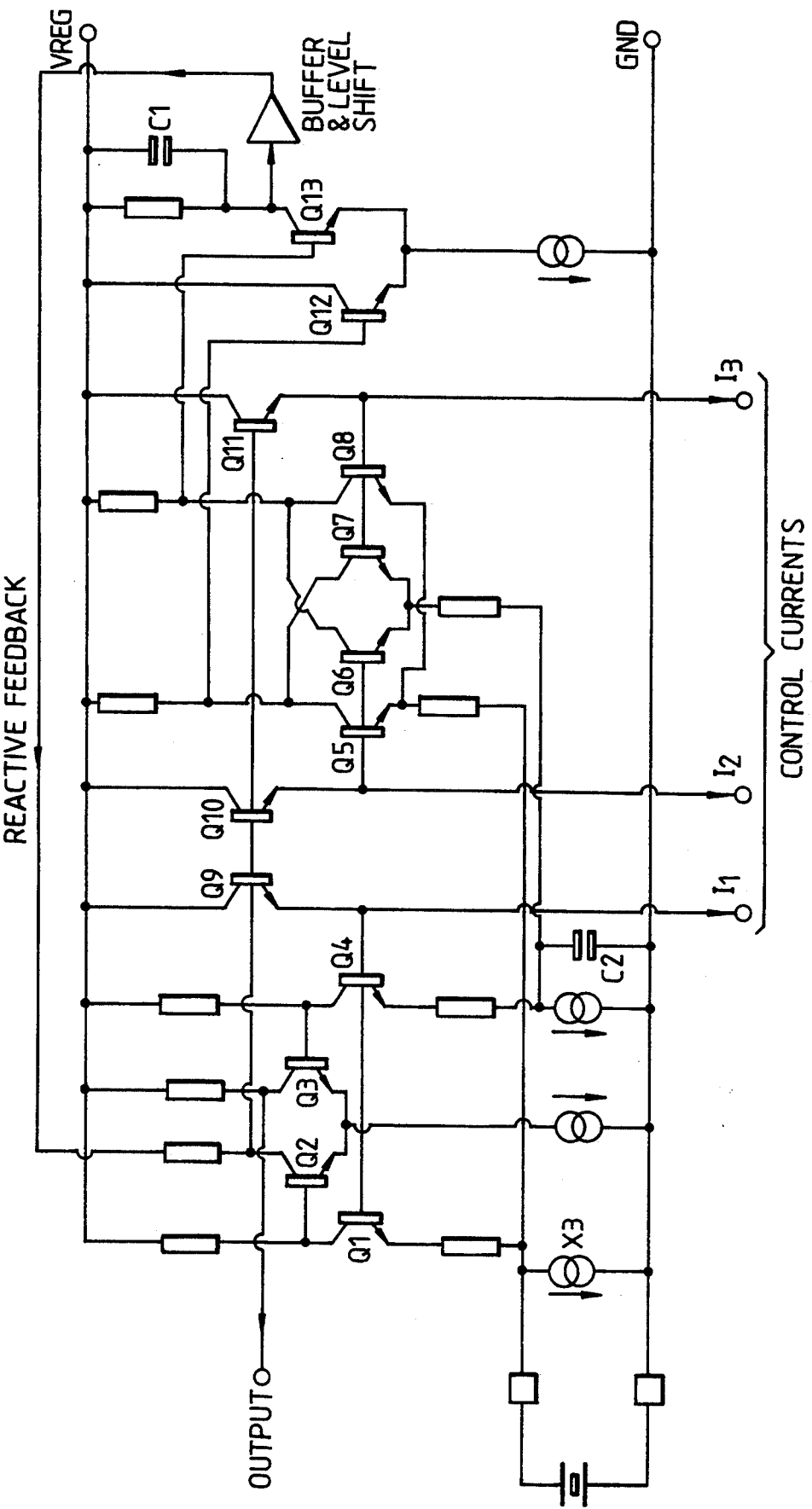

FIG. 6 illustrates a bipolar version of the oscillator technique designed to allow operation with one end of the crystal grounded. We may observe that the relative transconductances of the devices are here controlled using the principles of the Gilbert multiplier allowing simple current control of reactance and circuit gain.

The use of a single ended design reaches the required value of the reference impedance (capacitor C61). This of course is an important factor when the circuit is to be provided in integrated form.

The differential amplifier provided by function Q12 and Q13 allows pulling of the oscillation in both directions and this facilitates compensation for the crystal capacitance (Co). This compensation is effected with the differential amplifiers provided by transistors Q2 and Q3 and by transistors Q6 and Q7. Reactive voltage feedback to maintain oscillation is provided by a buffer amplifier A71. Transistors Q5 and Q8 provide current steering to control the differential amplifiers (Q12, Q13) so as to achieve pulling of the oscillator.

Figure 7:
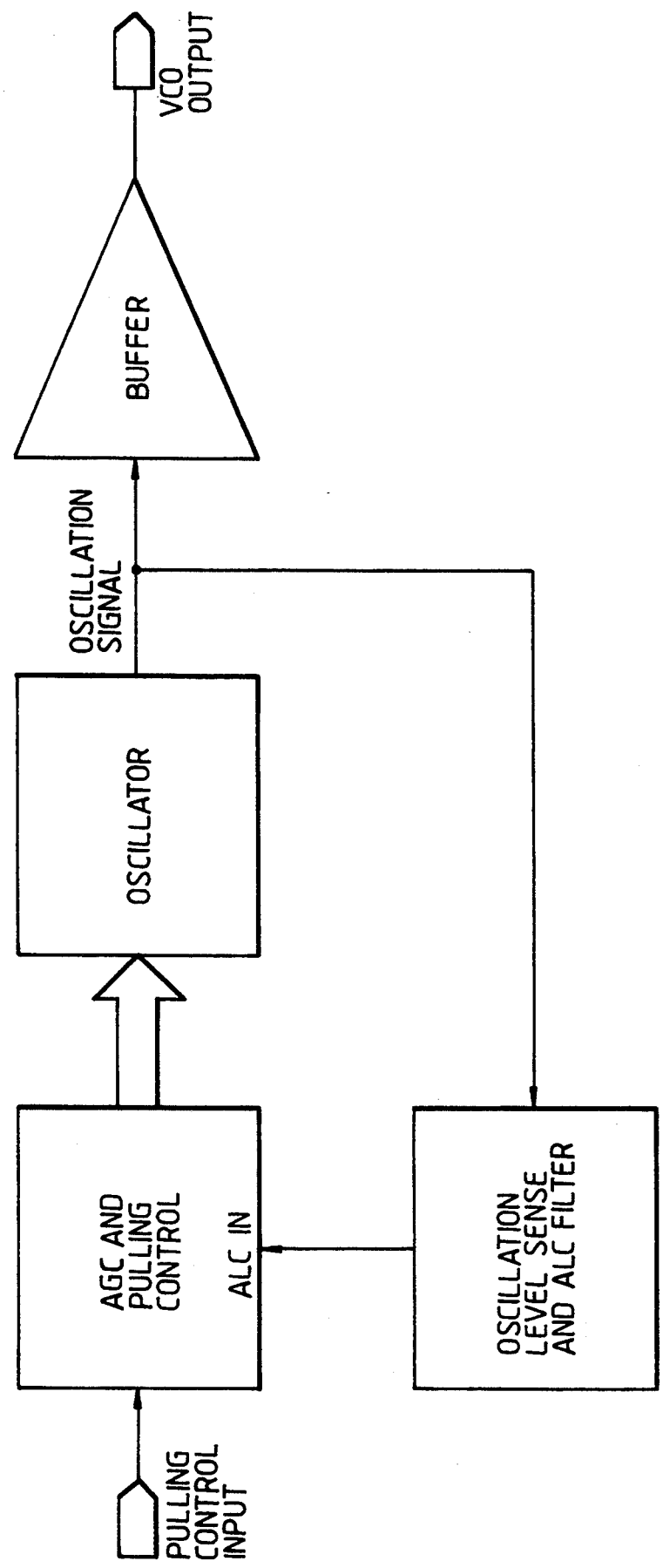
FIG. 7 shows in schematic form a voltage controlled oscillator arrangement employing the crystal oscillator circuit of FIG. 4.

Referring now to FIG. 7, this shows in schematic form an oscillator arrangement employing the principles described above. The crystal oscillation is controlled from a pulling control input via an AGC and pulling control circuit. Loop gain is determined from a feedback signal provided by an oscillation level sensor and automatic level control (ALC) filter. Typically the oscillator output is obtained via a buffer amplifier.

Figure 8:
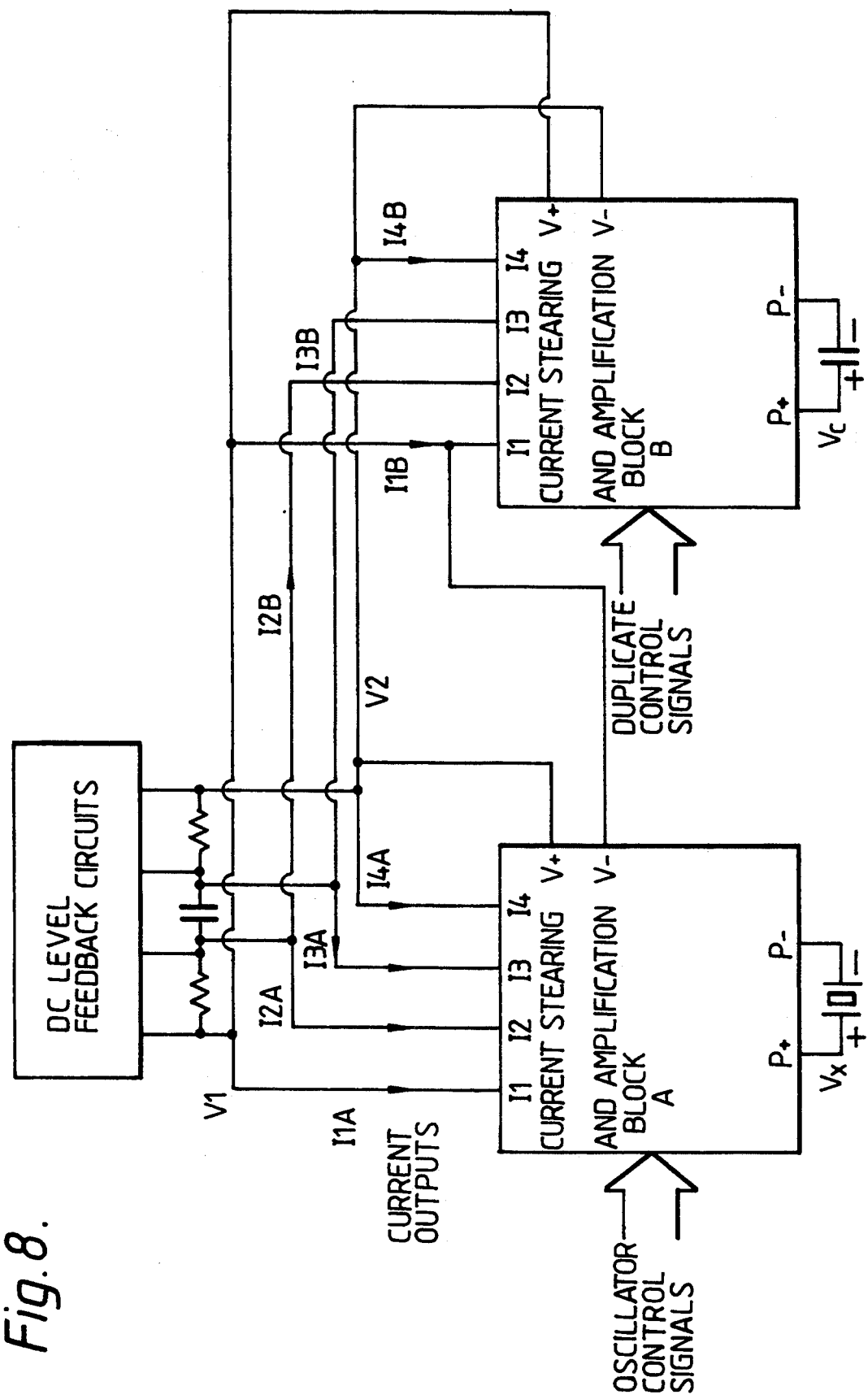

The crystal oscillator is shown in more detail in FIG. 8. In this arrangement the oscillator, or current steering and amplification block corresponds e.g. to the circuit of FIG. 4. A similar circuit block is also provided in which a capacitor C81 occupies the function analogues to that of the crystal X81 in the other similar circuit block. The purpose of the second oscillator block is to provide compensation for the capacitance (Co) of the crystal X81. Preferably the value of the compensating capacitor C81 is equal to Co.

The circuit of FIG. 8 is arranged such that $$Vx = k(V1 - V2)$$

$$Vc = -k(v1 - V2)$$

Figure 9:
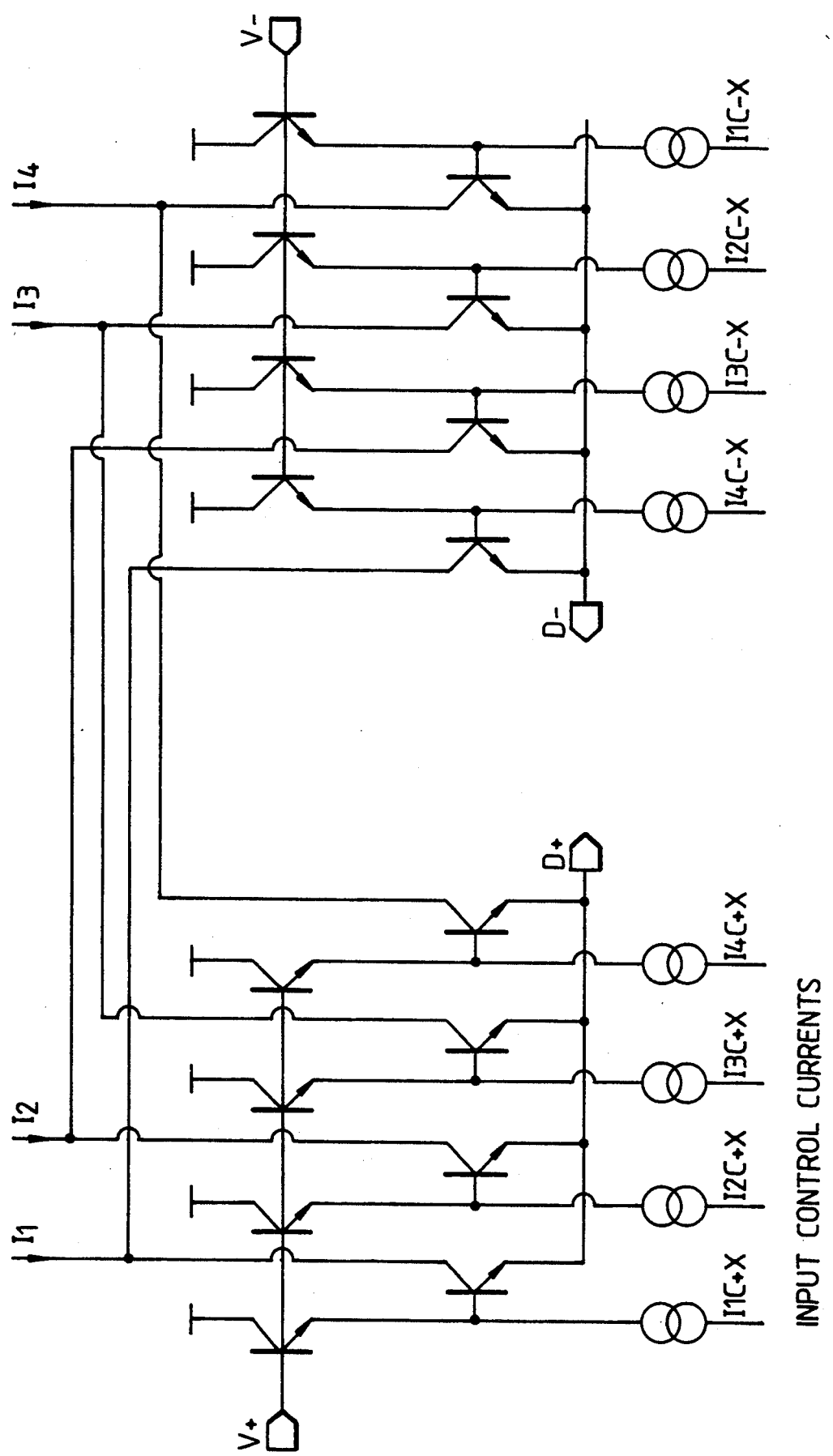

The current steering and amplification block of FIG. 8 (and its substantially identical duplicate) is illustrated in FIG. 9. This is a bipolar circuit construction which is analogous to the field effect circuit of FIG. 4 and which operates in a similar manner.

Figure 10:
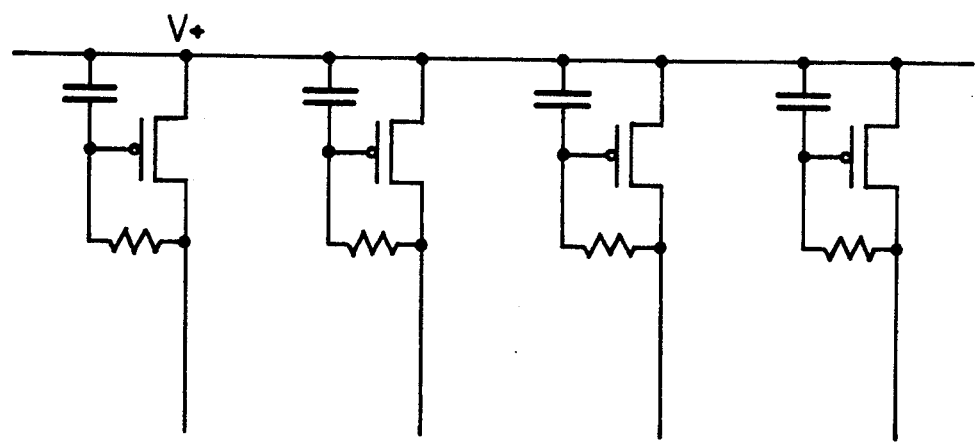

A typical DC level feedback circuit corresponding to the DC level feedback block of FIG. 9 is illustrated in FIG. 10.

Figure 13:
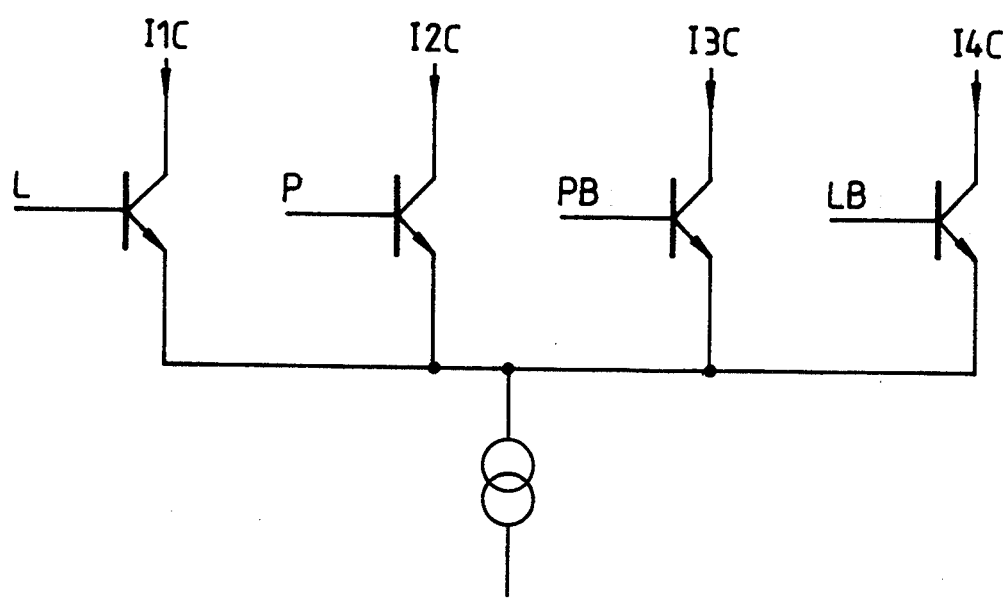
Figure 12:
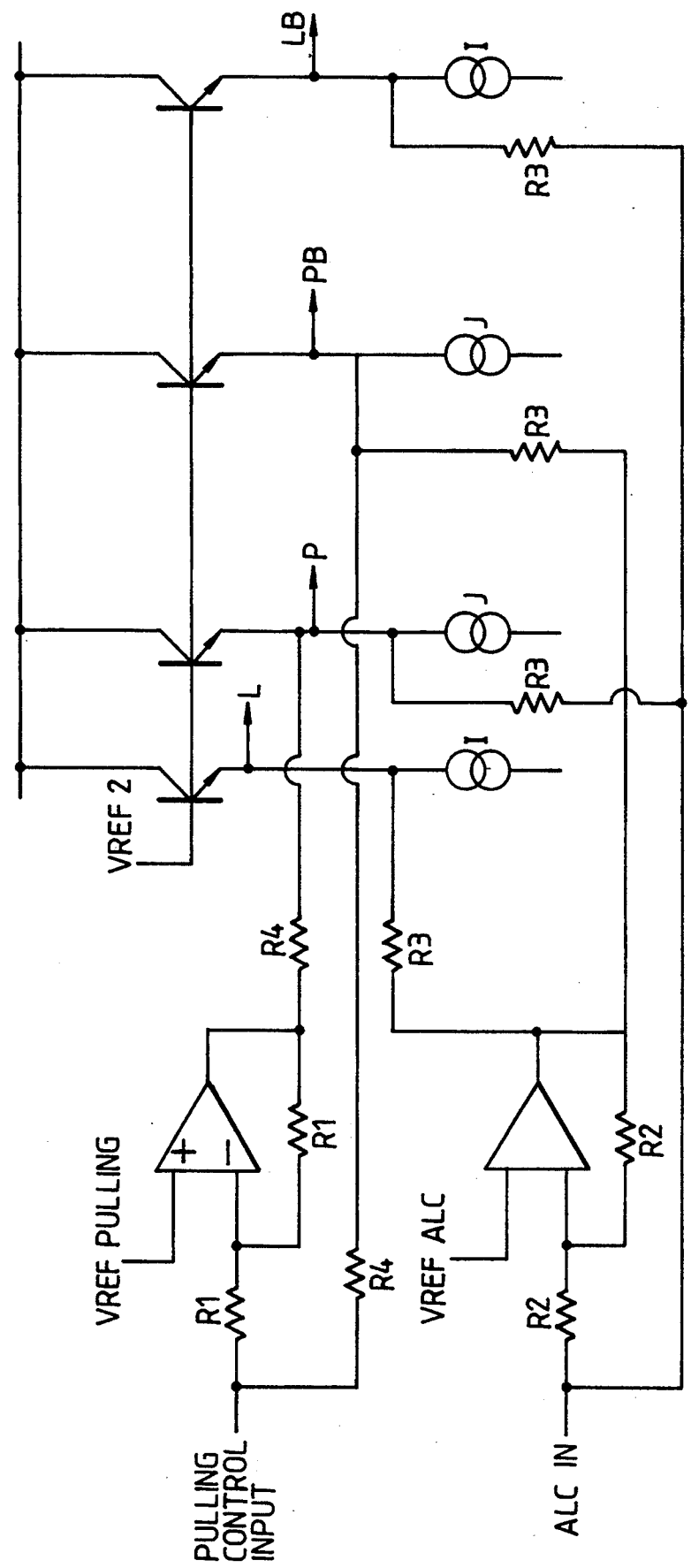

The pulling control of FIG. 7 and its relationship to the current steering and amplification blocks is shown schematically in FIG. 11 and in more detail in FIGS. 12 and 13 which shows respectively the construction of the control voltage generator and the control current generator blocks.

It will be appreciated that the circuit construction of FIG. 7 to 13 is given by way of example only and is in no way to be considered limiting in the use of the technique.

It will be appreciated that the technique described above is not limited to the Butler configuration, but that other circuit configurations may also be employed. In essence the technique provides a variable reactance preferably in series with the crystal whereby that reactance, in conjunction with the crystal reactance, determines the frequency of the circuit.

It will also be understood that the technique may be applied not only to crystal oscillators, but also to other devices such as frequency and Q tuning of filters, and to LC oscillators.

The arrangement will find particular application in temperature compensation of oscillators, frequency modulation, and phase locked loops.

I claim:

1. A frequency tuneable crystal oscillator arrangement, including a piezo-electric crystal, means for providing a drive current to the crystal, a reactance into which a current corresponding to the crystal current is fed whereby to develop a corresponding voltage across that reactance, and an adjustable gain amplifier for amplifying said voltage and for feeding said amplified voltage back to the crystal, wherein said reactance is arranged in series with the crystal, and wherein the reactance comprises a plurality of different impedances, there being current steering means for dividing the current corresponding to the crystal current between the impedances whereby to determine the effective value of the reactance in series with the crystal whereby to control the crystal frequency.

2. An oscillator as claimed in claim 1, wherein said reactance comprises first and second capacitors.

3. An oscillator as claimed in claim 1, wherein the current steering is provided by a plurality of bipolar transistors where emitters receive the current to be divided or steered, there being base control means for determining the proportion of the current passing into each said transistor.

4. An oscillator as claimed in claim 1, wherein the current steering is provided by a plurality of field effect transistors whose source terminals receive the current to be divided or steered, there being gate control means for determining the proportion of the current passing into each said transistor source.

5. An oscillator as claimed in claim 3, wherein the steered current is a linear function of the current passed by the crystal.

6. An oscillator as claimed in claim 1 and comprising a Butler oscillator.

* * * * *